(12) United States Patent
Kawase

(10) Patent No.: US 7,364,996 B2
(45) Date of Patent: Apr. 29, 2008

(54) METHODS OF FABRICATING PATTERNED LAYERS ON A SUBSTRATE

(75) Inventor: Takeo Kawase, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 150 days.

(21) Appl. No.: 10/482,297

(22) PCT Filed: Aug. 20, 2002

(86) PCT No.: PCT/IB02/05807

§ 371 (c)(1),
(2), (4) Date: Apr. 27, 2004

(87) PCT Pub. No.: WO03/034130

PCT Pub. Date: Apr. 24, 2003

(65) Prior Publication Data

US 2004/0253835 A1 Dec. 16, 2004

(30) Foreign Application Priority Data

Aug. 20, 2001 (GB) ................................ 0120230.8

(51) Int. Cl.
*H01L 21/20* (2006.01)
(52) U.S. Cl. .................. 438/584; 438/256; 438/500
(58) Field of Classification Search ................ 438/669, 438/597, 674, 142, 149, 584, 678, 666, 256, 438/339, 478, 641, 586, 497, 500, FOR. 475
See application file for complete search history.

(56) References Cited

U.S. PATENT DOCUMENTS 5,132,248 A 7/1992 Drummond et al.

(Continued)

FOREIGN PATENT DOCUMENTS

EP  0 880 303 A1  11/1998

(Continued)

OTHER PUBLICATIONS

Kawase et al., "All-Polymer Thin Film Transistors Fabricated by High-Resolution Ink-Jet Printing," IEEE pp. 623-626, 2000.

*Primary Examiner*—Zandra V. Smith
*Assistant Examiner*—Thanh Y. Tran
(74) *Attorney, Agent, or Firm*—Oliff & Berridge, PLC

(57) ABSTRACT

A method of fabricating a pattern on a substrate, comprises the steps of: depositing; such as by ink-jet printing, multiple drops of a first liquid material as a first deposit (15) on the substrate: depositing, such as by ink-jet printing, multiple drops of a second liquid material (17) as a second deposit on the substrate, and in contact with the first material (15) while the first material is liquid, the first and second liquid materials being mutually immiscible; and producing on the substrate a solid deposit from at least one of said liquid materials. In a preferred embodiment, the method comprises ink-jet printing multiple drops of liquid material immiscible with said second liquid material as a third deposit (16) on the substrate, the third deposit (16) being spaced from the first (15) by a predetermined gap and the second deposit (17) applied in said gap overlapping the first and third deposits (15, 16). At least one of the deposits may contain a suspension or solute, and said solid deposit may be formed by solidification of at least one of said liquids. Applicable to the production of thin-film transistor arrays or other integrated circuits.

33 Claims, 12 Drawing Sheets

U.S. PATENT DOCUMENTS

| | | | |
|---|---|---|---|
| 5,185,835 A * | 2/1993 | Vial et al. | 385/49 |
| 5,736,074 A * | 4/1998 | Hayes et al. | 264/6 |
| 5,995,188 A * | 11/1999 | Shimizu et al. | 349/147 |
| 6,057,242 A * | 5/2000 | Kishimoto | 438/692 |
| 6,120,130 A * | 9/2000 | Hirano et al. | 347/46 |
| 6,180,297 B1 * | 1/2001 | Tam et al. | 430/41 |
| 6,270,389 B1 * | 8/2001 | Kobayashi et al. | 445/24 |
| 6,413,790 B1 * | 7/2002 | Duthaler et al. | 438/21 |
| 2002/0173075 A1 * | 11/2002 | Tie et al. | 438/108 |

FOREIGN PATENT DOCUMENTS

| | | |
|---|---|---|
| GB | 406933 | 3/1934 |
| WO | WO 01/47043 A1 | 6/2001 |
| WO | WO 01/47045 A1 | 6/2001 |

* cited by examiner

METHODS OF FABRICATING PATTERNED LAYERS ON A SUBSTRATE

The present invention relates to methods of fabricating patterned regions on a substrate. The invention is applicable to the production of thin film transistor arrays or other integrated circuits.

EP-A-0 880 303 describes a method of producing organic electro-luminescent elements or display devices in which pixel electrodes are formed on a transparent substrate and luminescent layers of an organic compound are patterned on the pixel electrodes by means of an ink-jet method. This enables precise patterning quickly and easily and allows simple adjustment of luminous efficiency.

More recently, the fabrication of all polymer thin film transistors using ink-jet printing was described in the paper entitled "All-Polymer Thin Film Transistors Fabricated by High-Resolution Ink-Jet Printing" by Kawase, Sirringhaus, Friend and Shimoda, published in Technical Digest of International Electron Devices Meeting 2000 on Dec. 10, 2000.

The ink-jet patterning technique has a resolution which is rather too low for fabricating microelectronics devices such as field-effect transistors, which requires a capability for resolving patterning having dimensions less than 20 microns. A droplet fired from an ink-jet head has a diameter in the order of a few tens of microns, which is large in comparison to the required resolution. Furthermore the drops spread to an even larger size which is determined by the surface tensions and the interfacial tension, as will be explained hereinafter.

Also, droplets fired from the nozzle of an ink-jet head have some fluctuation in flight direction owing to the scattering quality of nozzles and changeable wetting conditions around the nozzles. Moreover, the surface of substrates is not completely homogenous in wettability. This gives rise to irregularities in patterns with deposited material and in the case of patterning for short channels of TFTs fatal short-circuits may occur.

In order to solve these problems according to the Kawase paper referred to above, source or drain electrodes are printed using a conducting polymer (poly(3,4-ethylenedioxythiophene), PEDOT) solution on substrates with patterned wetting and de-wetting regions. More specifically, a polyimide (PI) layer is deposited on a substrate by spin coating from a precursor solution and is then etched using photolithography and $O_2$ plasma to provide a PI strip of width 5 μm. The PI strip serves as a template, and enables high resolution ink-jet printing to be achieved, by controlling the flow of solution on the substrate. The template has hydrophilic surfaces on the adjoining etched region of the substrate and hydrophobic properties on the PI strip itself. When droplets of water-based PEDOT solution are deposited onto the etched region along the PI strip, the solution flows up to the edge of the PI strip but remains confined in the etched region. Accordingly, the channel length may be precisely controlled to the width of the PI strip. This enables a channel length down to 5 μm to be achieved without short-circuits. The technique also enables the fabrication of printed inverters in which components such as gate electrodes, interconnections, via-holes or resistors are patterned with the ink-jet technique.

The Kawase paper accordingly teaches ink-jet printing onto a pre-patterned substrate which has wettability contrast, in order to fabricate a channel of a thin film transistor as short as 5 microns. However, production of the pre-pattern of polyimide using photolithography and dry etching is rather expensive, which reduces the advantage of the ink-jet printing.

An object of the invention is to provide a high-resolution patterning method which uses a deposition technique but does not require pre-patterned substrates.

A further object of the invention is to provide a method of fabricating a patterned layer on a substrate in which a line width less than 5 μm may be readily achieved.

According to one aspect of the invention there is provided a method of fabricating a pattern on a substrate comprising the steps of: depositing multiple drops of a first liquid material as a first deposit on the substrate; depositing multiple drops of a second liquid material as a second deposit on the substrate, and in contact with the first material while the first material is liquid, the first and second liquid materials being mutually immiscible; and producing on the substrate a solid deposit from at least one of said liquid materials.

In a particularly advantageous embodiment, the method further comprises depositing multiple drops of liquid material immiscible with said second liquid material as a third deposit on the substrate, the third deposit being spaced from the first by a predetermined gap and the second deposit being applied in said gap overlapping the first and third deposits. Here a solid deposit is preferably produced from the second liquid material.

The second liquid material has to be immiscible with the liquid material of the first and third deposits, which themselves will normally, but not necessarily, be of the same material.

In another advantageous embodiment, the method further comprises depositing multiple drops of liquid material immiscible with said first liquid material as a third deposit on the substrate, the third deposit being applied in contact with the first material while the first material is liquid and being spaced from the second material by a predetermined gap containing the first deposit.

Here solid deposits are preferably produced from both the second and third liquid materials.

Moreover, the second and third liquid materials are normally but not necessarily, of the same material and have to be immiscible with the first liquid material.

Conveniently, any one or more of the first, second and third deposits is provided by depositing liquid material by means of ink jet printing. However, the deposition may be made by other techniques, such as bubble jet printing.

A major field of application of the invention is to fabricate a conductive pattern on a substrate for an integrated circuit. Particularly in this case at least one of the deposits may carry a suspension or solute of an electrically conductive material, e.g. PEDOT or metal particles. Following evaporation of the liquid from the three layers, the electrically conductive material will remain on the substrate. If desired, one or more of the deposits may contain a suspension or solute of a non-conductive material, such as a polymer. Such polymer would then also remain on the substrate surface after evaporation of the liquid.

Instead of being in suspension or solution, the material of any solid deposit may be derived from solidification of the deposited liquid material.

For many applications, the target material may be an electrically conductive material, but other options are possible. For example, with transparent polymer as a target material, one can print an optical interconnection (waveguide) on a substrate. With inorganic colloid or polymer for the target material, a wall structure can be fabricated, which may be useful for a separator in plasma display panels.

In one embodiment, the first and third deposits serve only as confining regions and the second deposit is a target layer and accordingly contains a suspension or solute of electrically conductive material, such as PEDOT or Au colloid or is itself an electrically conductive, solidifiable material. This is suitable for forming interconnection lines, such as gate or data lines, in an integrated circuit. Where the Au colloid is formed in xylene, the confining deposits may be water or a polar organic solvent such as acetone or ether. Where PEDOT is suspended in water, the confining deposits may consist of a non-polar hydrocarbon solvent such as toluene and may, if desired, carry a polymer solute.

In another embodiment, the first and third deposits are target regions and the second deposit serves only as a spacing region. This technique is suitable for forming the source and drain regions of a field-effect transistor, e.g. a thin film transistor (TFT). Here, the target regions may comprise a suspension of PEDOT in water and the spacer may be of toluene. Alternatively, the target regions may comprise a xylene-based Au colloid, when the spacer may consist of water or a polar organic solvent, such as acetone or ether.

The method may be applied to the production of a thin film transistor having a channel length less than 50 μm. In one embodiment, a channel length of less than 20 μm may be achieved.

For a better understanding of the invention and to show how the same may be carried into effect, reference will now be made, by way of example, to the accompanying drawings, in which.

Figure 1:
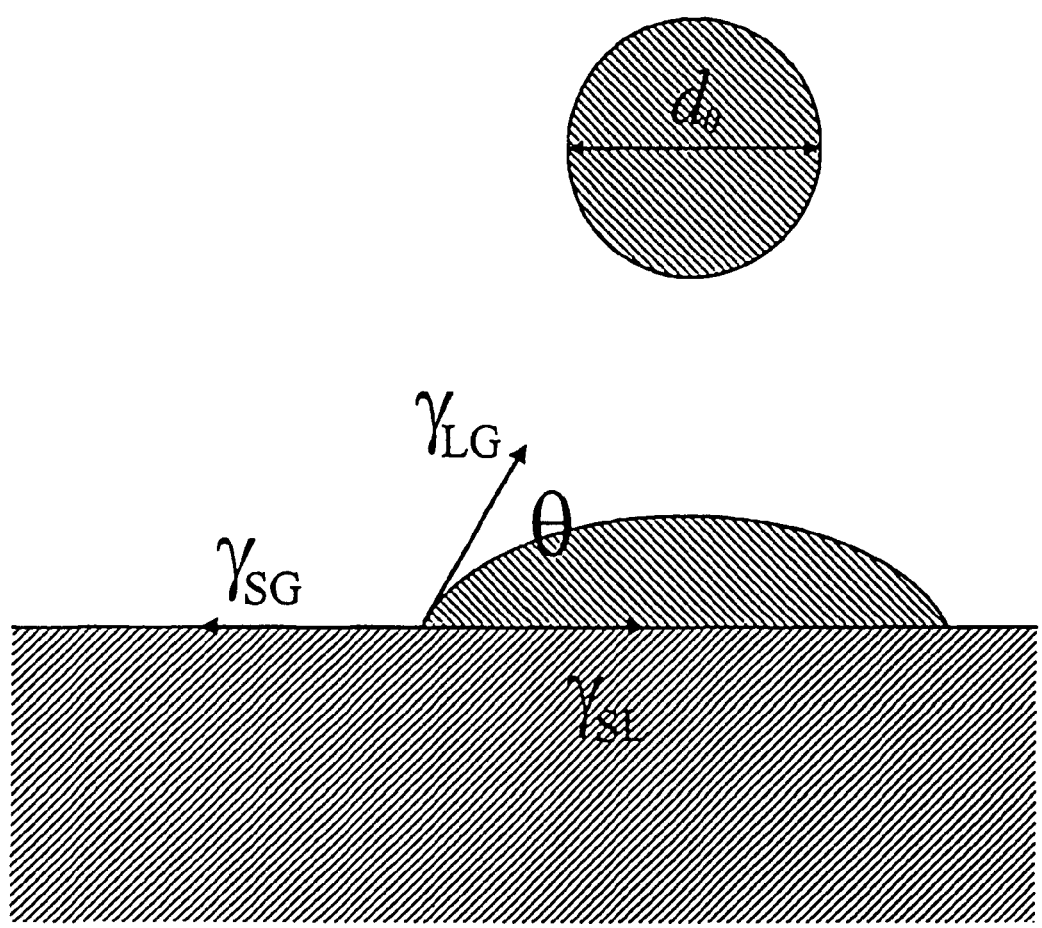
FIG. 1 is a schematic explanatory force diagram.

FIG. 1 of the accompanying drawings is an explanatory diagram showing the equilibrium condition which is achieved when a drop of ink of diameter $d_0$ is impacted on a solid surface, here considered to be glass. As shown in the Figure, where $\gamma_{SG}$ is the surface tension force over the exposed glass surface and $\gamma_{LG}$ is the surface tension force over the exposed ink surface, whereas $\gamma_{SL}$ is the interface tension force, Young's law states the following:

$$\gamma_{LG} \cos \theta = \gamma_{SG} - \gamma_{SL}.$$

By applying these principles, the equilibrium diameter $d_{glass}$ of the resulting deposited ink drop on the glass substrate may be calculated for various possible liquids. The results may be tabulated as follows when the original diameter of the drop $d_0 = 30$ μm.

| Liquid constitution | $\gamma_L$ (mJ/m$^2$) | $d_{glass}$ (μm) |
|---|---|---|
| Water | 73 | 40-80 |
| Polar organic solvent | 40-50 | 60-100 |
| Non-polar organic solvent | 15-30 | 100-300 |

Thus, it is difficult to pattern fine structures with conventional ink-jet printing techniques. The diameters in the above table are too large to fabricate fine patterns for thin film transistors.

Figure 2:
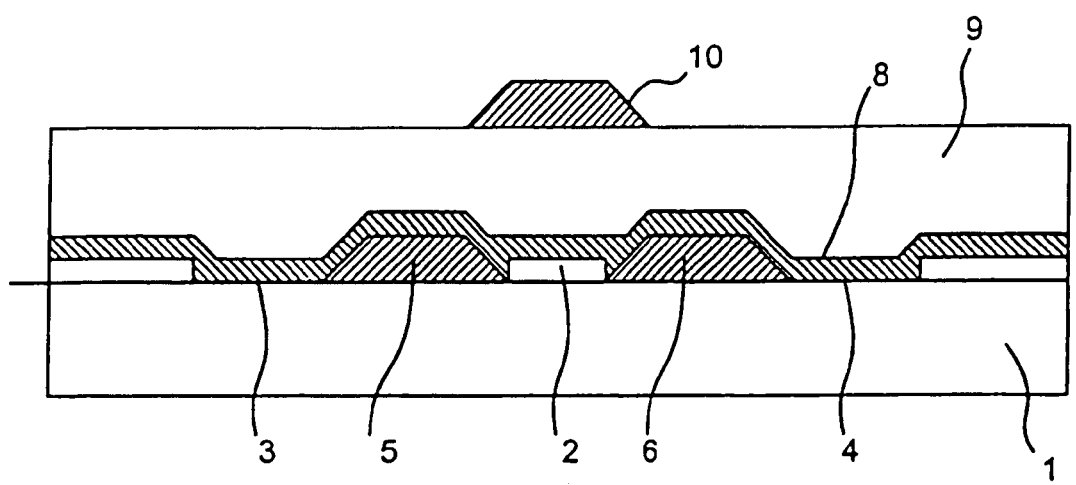
FIG. 2 is a schematic sectional view of a top gate thin film transistor.
Figure 3:
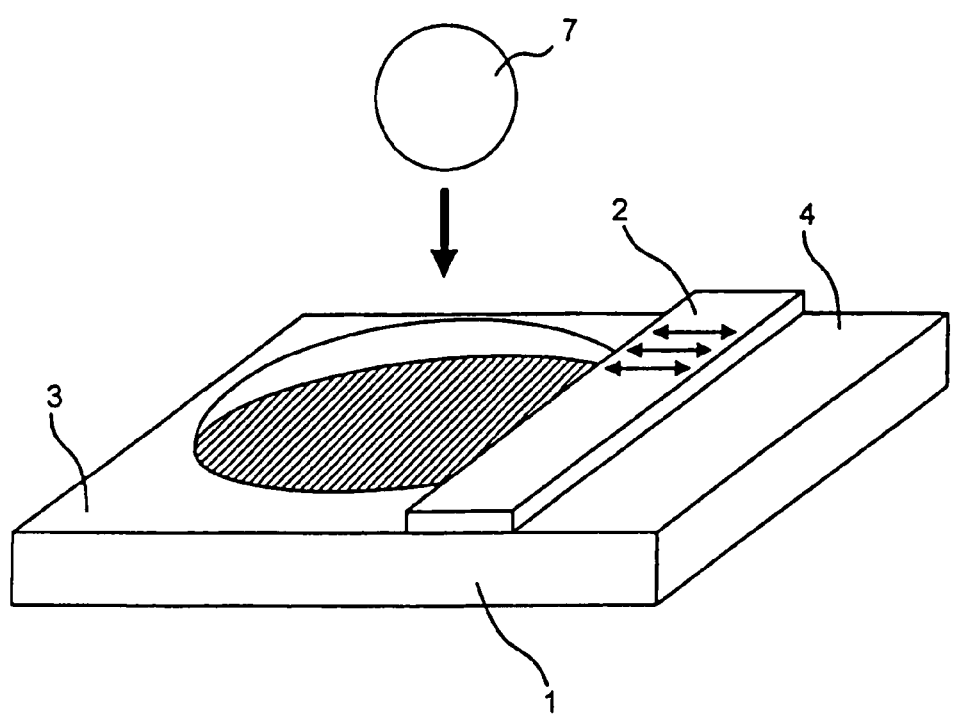
FIG. 3 shows schematically a drop of ink impacting on a substrate following projection by an ink-jet printing head.

FIG. 2 shows a cross-sectional view through a prior art top gate thin film transistor. On the substrate 1, a layer of polyimide is deposited by spin coating from precursor solution, is then cured and is then etched using photolithography and O$_2$ plasma to remove the polyimide in the regions 3 and 4, leaving a strip 2 of polyimide. Subsequently, source and drain regions 5 and 6 are applied to the etched regions 3 and 4 using an ink-jet printing technique. As shown in FIG. 3, a drop of ink 7 impacts on the etched region 3 and then spreads in the direction of the polyimide strip 2. Since the etched region 3 has a hydrophilic surface, whereas the PI strip 2 has a hydrophobic surface, spreading of the ink is arrested when it meets the lateral edge of the PI strip 2. Accordingly, using this technique, a source region 5 and a drain region 6 may be deposited by ink-jet printing at a fixed precise spacing defined by the width of the PI strip 2. A layer 8 of semiconductor is then deposited over the entire surface by spin coatings from solution using an appropriate organic solvent. An insulator layer 9 is then applied, also spin coated from solution using an appropriate solvent. Finally, a gate electrode 10 may be ink-jet printed on the surface of the insulator 9.

The source, drain and gate electrodes are ink-jet printed using a solution of conductive conjugated polymer called PEDOT (polyethylene dioxythiophene), available under the trade name Baytron P from Bayer AG. The semiconductor layer is a conjugated copolymer of fluorene-bithiophene and the insulating layer 9 is formed of polyvinyl phenol. The semiconductor layer 8 has a thickness in the region of 20 nm and the insulating layer 9 has a thickness in the region of 500 nm.

Using the techniques described in conjunction with FIG. 2 it has previously been possible to construct a thin film transistor where the channel length is essentially defined by the width of the PI strip 2.

Figure 4:
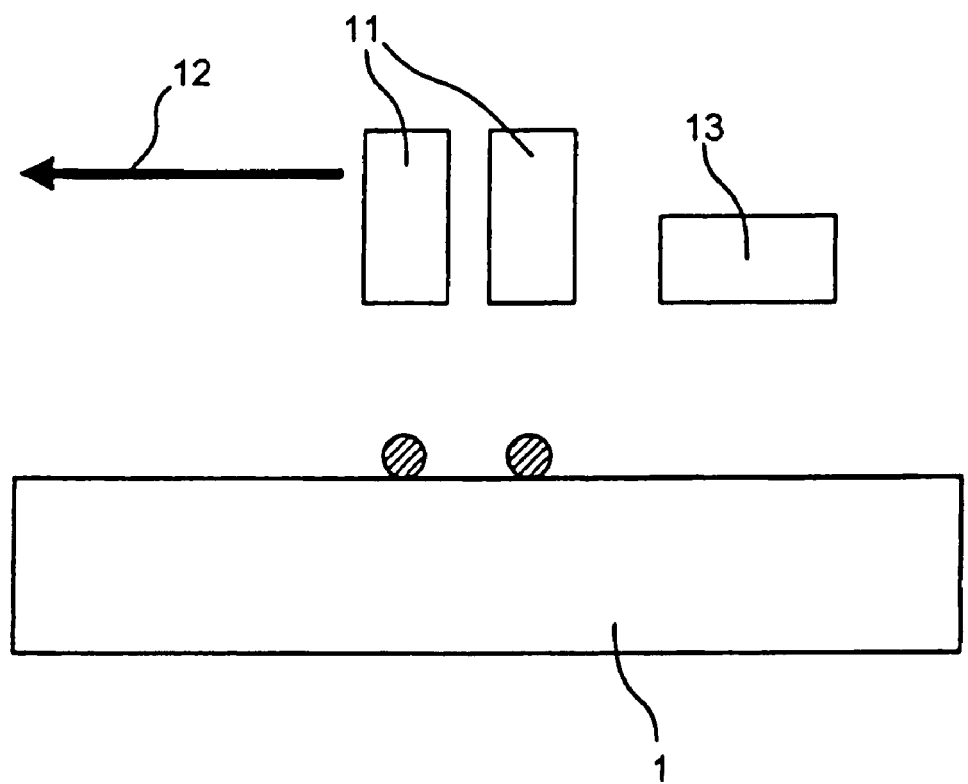
FIG. 4 is a schematic illustration of an ink-jet head applying liquid droplets to a substrate.

FIG. 4 is a schematic diagram showing ink-jet printing apparatus for the application of liquids to a substrate 1. The Figure shows the ink-jet apparatus having two heads 11 movable in the direction 12. The heads 11 are mutually offset in the direction perpendicular to direction 12 to allow simultaneous printing of two spaced lines of liquid droplets. A dryer 13 is provided to speed the drying process of the deposited liquid.

Figure 5:
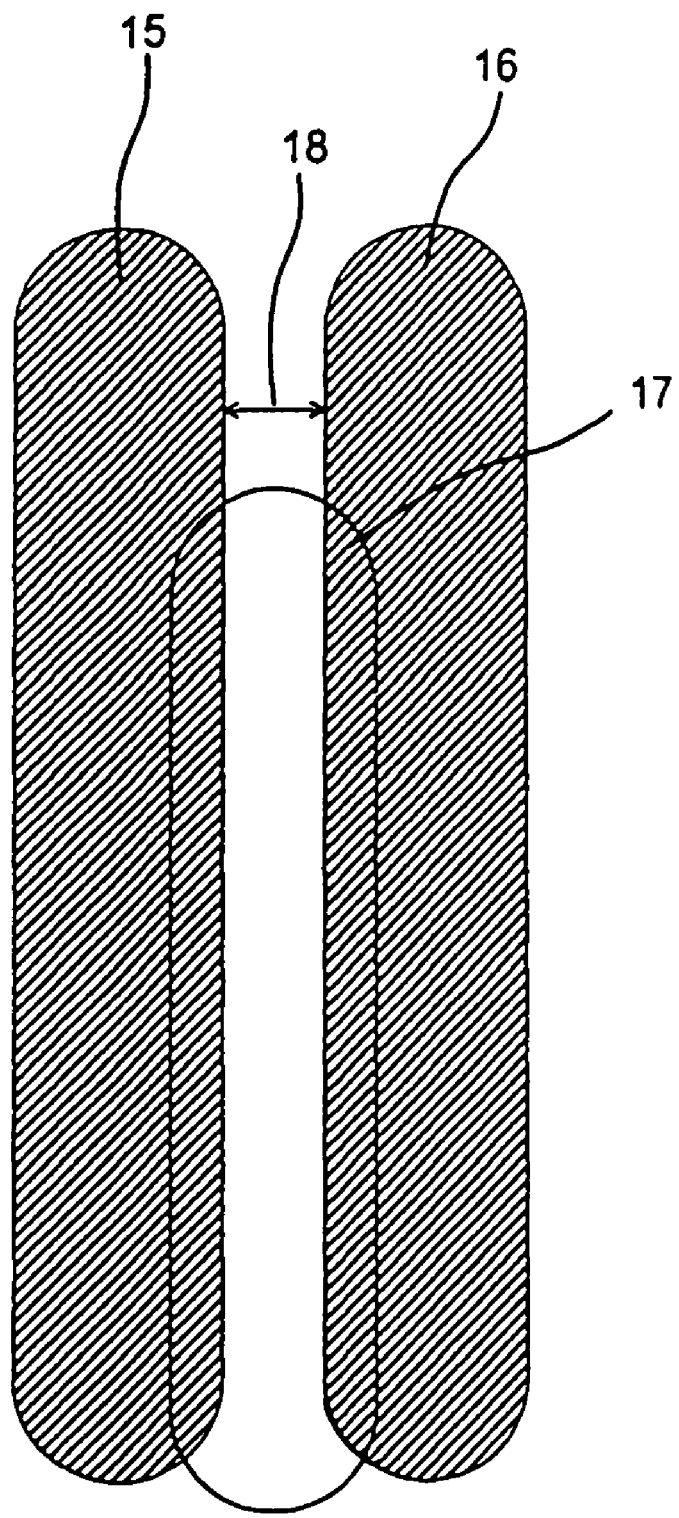
FIG. 5 is a schematic illustration of liquid layers applied to a substrate in plan view.
Figure 6:
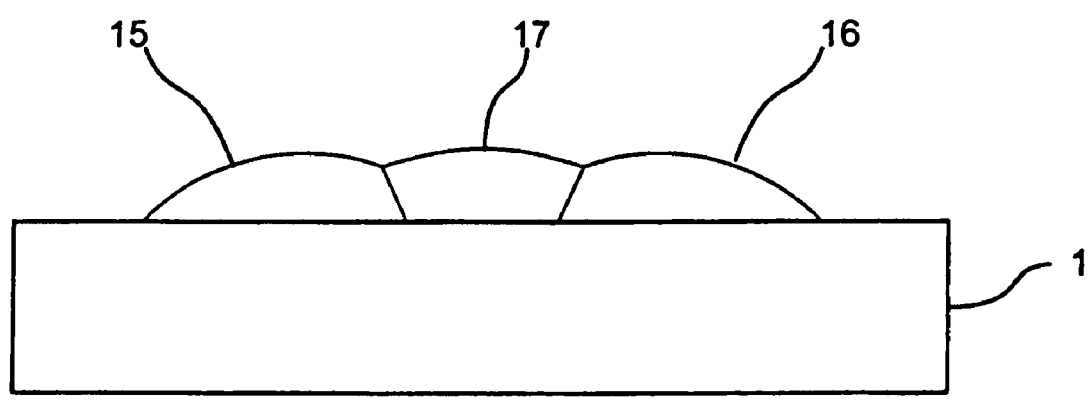
FIG. 6 is a schematic illustration of the liquids of FIG. 5 in cross-sectional view.

A first way of putting the invention into effect will now be described with reference to FIG. 5. As a first step, first and second linear deposits 15 and 16 of confining liquid are produced by ink-jet printing multiple drops of liquid along a substrate separated by a narrow gap 18. A third strip 17, referred to hereinafter as target material, is then deposited by ink-jet printing multiple drops of liquid over the top of the gap 18 and partially overlapping the confining material 15 and 16 (while the latter are still wet). The resulting application of liquid regions will then appear as shown in FIG. 6 in vertical transverse cross-section. Owing to the effect of surface tension on the wet liquid strips, similar to the discussion in conjunction with FIG. 3, the three deposits 15, 16 and 17 will stabilize to the geometrical configuration illustrated in FIG. 6. As a consequence, spreading of the third strip 17 is arrested by the second linear deposits 15 and 16 and the width of the third strip becomes narrower than that of a strip simply inkjet-printed on a substrate. Furthermore, any irregularities or inaccuracies in the spacing between the confining regions 15 and 16 are smoothed out and linearized so that essentially the boundaries between the regions 15 and 17 on the one hand and 16 and 17 on the other hand are straight and planar. In this configuration, the target material is preferably deposited with the trailing ink-jet head between the confining material which has already been deposited on the substrate with the leading ink-jet head.

The gap between the first and second linear deposits or strips of confining material can be changed by adjusting (a) physical distance between nozzles, (b) the angle of the mutual offset between the two heads in the scanning direction, or (c) the deposition (firing) rate of drops.

As soon as possible after deformation of the deposited liquids takes place due to surface tension, they need to be dried. The dryer 13 blows gas (such as dry air, nitrogen, inert gases) at the substrate. The gas can be heated to achieve rapid drying. The gas can include the same vapour as that forming the solvent in the deposited liquid used to control drying time. An alternative way of achieving quick drying is to heat the substrate. The combination of heating the substrate and heating the gas flow is the most effective.

Figure 7:
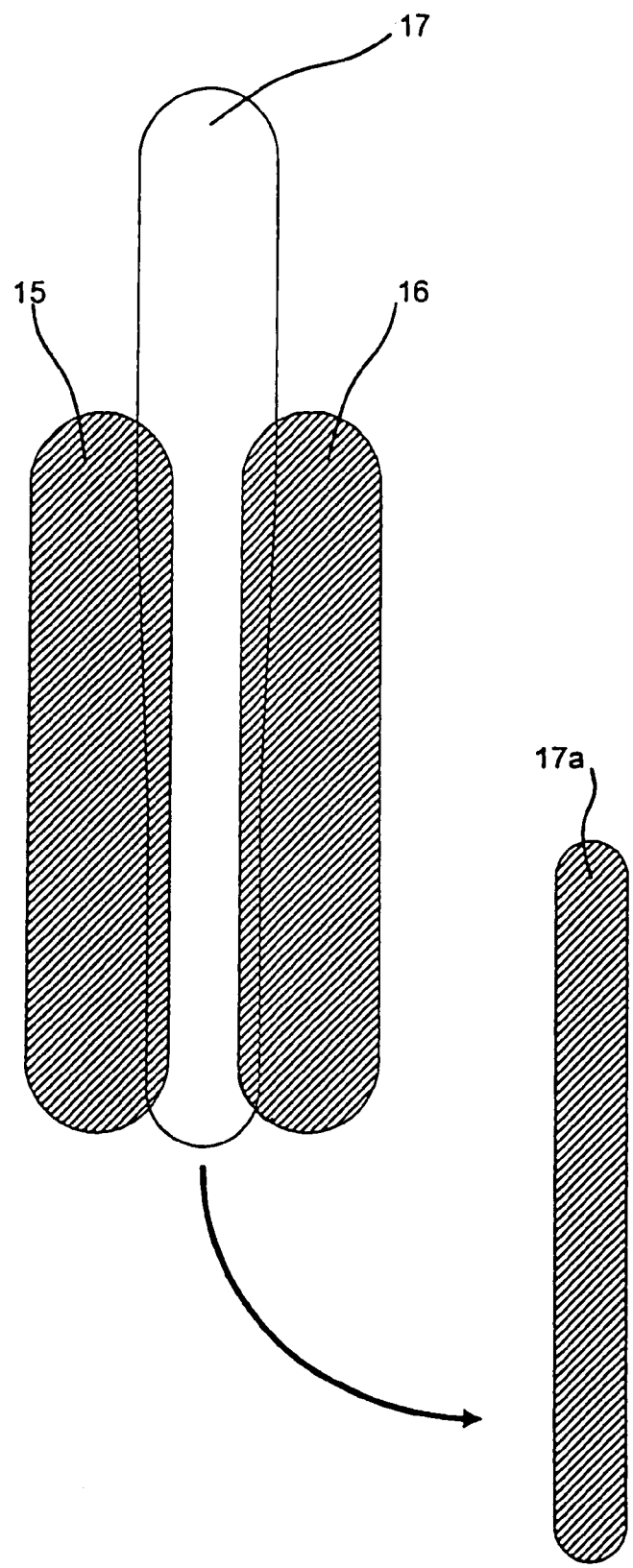
FIG. 7 is a schematic plan view of steps in the application of liquid to a substrate.

FIG. 7 shows in more detail the process which occurs during the application of the liquid deposits where the middle deposit is the target region and therefore contains a suspension or solute of a conductive material such as PEDOT, Ag, Cu, Au, Pt, Pd, Al. As may be seen, the target region 17 on initial deposit has a width determined by the contact angle of the liquid for the target region 17. However, as surface tension forces take effect and the system stabilises, the target region 17 becomes reduced in width until the configuration illustrated in FIG. 6 is attained. Following evaporation of the deposits 15 and 16, and of the liquid component of deposit 17, the conductive narrow strip 17a remains, as illustrated in the lower part of FIG. 7. Evaporation of the liquids may be assisted by a drying device, if desired and as described above.

Furthermore, there is a repulsive force between the first and second linear regions 15 and 16, which prevents them from physically connecting each other and prevents the third linear strip 17 from snapping. This repulsive force is caused by charging of the interfaces between the first or second deposit 15 or 16 and the third deposit 17. The charge on the interface is developed due to several mechanisms: (a) selective adsorption of ions onto the interface from the deposited liquid, (b) diffusion of ions from the one liquid into the other liquid, (c) adsorption or orientation of dipolar molecules at the interface, and (d) electron transfer between the two liquids due to differences in work function. When the charging effect is strong, merging of the first and second deposits 15 and 16 is well avoided. As explained above, ions or dipole molecules contribute to the charging. Thus water or polar solvent, in which ions or dipole molecules can dissolve, is preferably used for either the third deposit 17 or other deposits.

There will now be described an embodiment in which the central deposit, which is a confining region (or a separating region) is applied with the leading head, and the spaced apart deposits, which are target regions, are applied with the following head.

Figure 8:
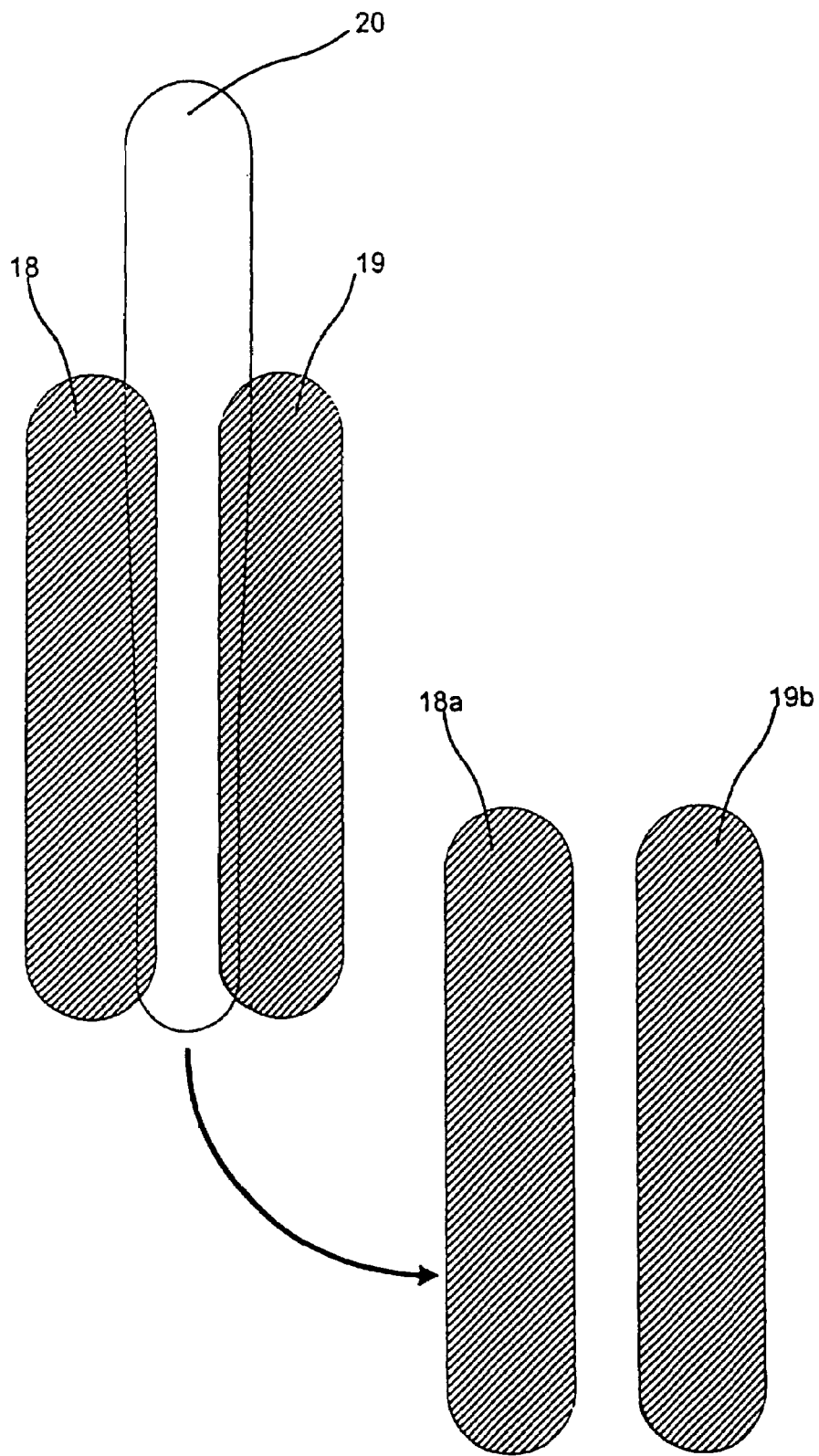
FIG. 8 is a schematic plan view of the application of liquids to a substrate according to an alternative method.

FIG. 8 shows such an alternative method in which the outer deposits 18 and 19 are here regarded as the target material and therefore contain a suspension or solute of electrically conductive material, such as PEDOT or Au, whereas the central deposit 20 here functions solely as a spacer. After application of the three deposits, the cross-sectional configuration corresponding to that shown in FIG. 6 is again achieved. Following evaporation of the deposit 20 and of the liquid components of the deposits 18 and 19, two target deposits 18a and 19a remain. It will be appreciated that by the application of the third spacing deposit 20, the interface between the spacing deposit and the outer deposits 18 and 19 may be made smoother and more uniform so that a uniform narrow gap between the target deposits 18a and 19a may be reliably-achieved. The third spacing deposit 20 serves to prevent the outer deposits 18 and 19 from forming bridges between them. This process makes it possible to pattern such a narrow gap with good reproducibility.

As explained in the previous method, there is a repulsive force between the deposits 18 and 19, which prevents them from merging into a single region even when the gap between the two deposits 18 and 19 becomes very small. When the charging effect at the interface is strong, merging of the two deposits 18 and 19 is well avoided. As explained above, ions or dipole molecules contribute to the charging. Thus water or polar solvent, in which ions or dipole molecules can dissolve, is preferably used for the target region or spacing deposit 20.

Figure 9:
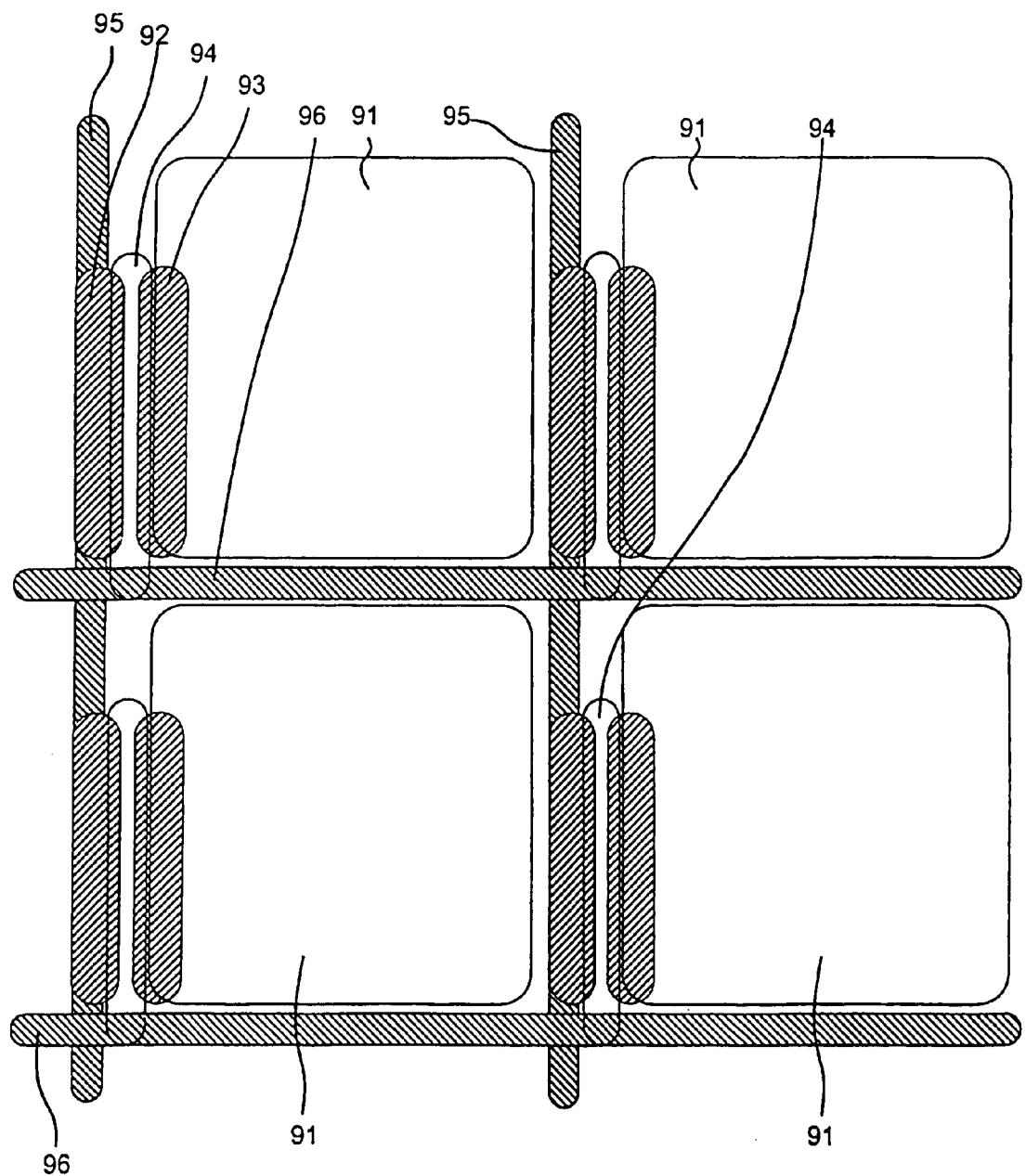
FIG. 9 is a schematic plan view of an active matrix TFT array.

FIG. 9 shows an example of a thin film transistor (TFT) array which may be constructed using the techniques according to the invention. Such a TFT array is used for an active matrix display. The Figure shows a plurality of pixel electrodes 91, each being provided with a respective thin film transistor, each comprising a source 92, a drain 93 and a gate electrode 94. Data lines 95 can be printed with gold colloid in hydrocarbon organic solvent using the technique described with reference to FIG. 7. Similarly gate lines 96 are also printed with gold colloid in hydrocarbon organic solvent using the technique of FIG. 7. Printing the data lines 95 and gate lines 96 with gold gives good conductivity, and this is important in a large TFT array because the resistance of long data lines 95 and gate lines 96 limits operational speed. The narrow data lines 95 and gate lines obtained with the technique of FIG. 7 result in high aperture ratio, which improves brightness and contrast in an active matrix display.

The source, drain and gate electrodes can preferably be printed with water-based PEDOT solution using the technique of FIG. 8. The pixel electrodes 91 can be also printed with water based PEDOT solution. These electrodes do not necessarily require high conductivity because the size of these elements is independent of the size of a TFT array and neither very long nor large. Thus PEDOT, which has relatively low conductivity (0.1-100 S/cm) compared with metals, is adequate for them. The water-based PEDOT solution has higher surface tension in comparison, and this is more preferable to form short channels. The PEDOT is also semi-transparent in the visible range, so this is suitable for pixel electrodes, which apply voltage or current to display elements.

PEDOT is suitable as the material for the source and drain electrodes and the metal colloid is suitable as the material for the interconnection. However, the other way round is also possible.

It will be appreciated that the technique described in conjunction with FIG. 7 may also be employed in the formation of a thin film transistor such as illustrated in FIG. 2 where the target strip 17a may replace the PI strip 2 and thus function as a template. In other words, using the technique shown in FIG. 7, the thin strip 17a may be applied to the substrate 1. Source and drain electrodes 5 and 6 of PEDOT may then be applied by ink-jet printing techniques along the respective sides of the strip 17a. As in the case of the polyimide strip produced in the prior art by means of etching, the strip 17a will have a hydrophobic surface which will arrest lateral spreading of the source and drain material and consequently accurately define the length of the transistor channel. A semiconductor layer may then be applied over the source 5, strip 17a and drain 6, followed by the application of an insulator layer and a gate electrode.

Alternatively, the layer 17a may itself be of semiconductor material and thus constitute the channel region of the transistor. This may avoid the need to apply a layer 8 of semiconductor material across the whole surface of the device.

It will be appreciated that, when the technique shown in FIG. 8 is employed to print the source and drain electrodes constituted by the target regions 18 and 19, a layer of semiconductor material may then be applied over the surface of the source and drain to provide the channel region between the source and drain electrodes. A layer insulator may then be applied, as usual, followed by a gate electrode. The gate electrode, the source and drain may all be ink-jet printed with water-based PEDOT solution.

Thus, in the construction shown in FIG. 9, all components of the thin film transistors, i.e. the source 92, drain 93 and gate 94, may be printed, using ink-jet printing techniques, preferably with water-based PEDOT solution.

Similarly, the data lines 95 and gate lines 96 may also be ink-jet printed, preferably using gold colloid in hydrocarbon organic solvent.

Using the techniques disclosed herein, the channel length of the TFTs as well as the width of the data lines and gate lines may be reduced to 10 μm, thus offering enhanced space-saving possibilities.

Figure 10:
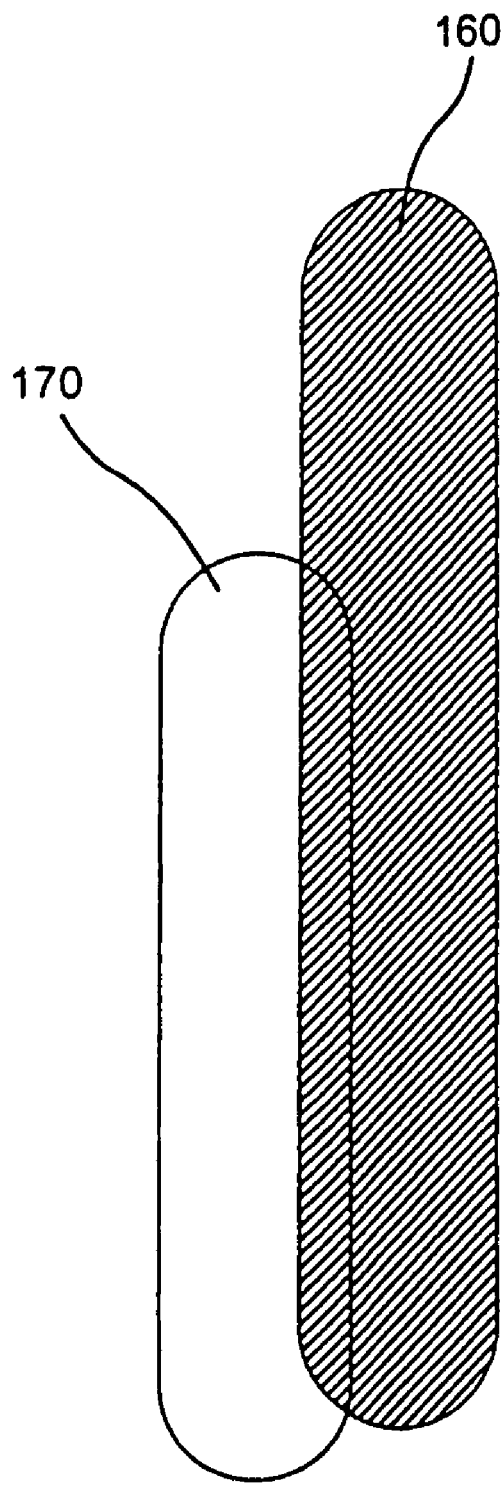
FIG. 10 is a schematic plan view of liquid layers applied to a substrate according to a further method.
Figure 11:
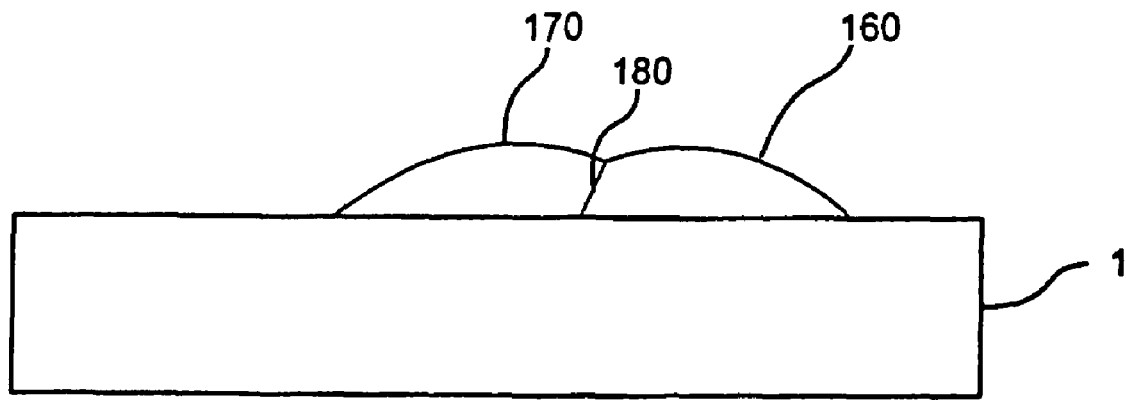
FIG. 11 is a schematic cross-sectional view of the liquid layers of FIG. 10.

FIG. 10 shows a method where only two deposits 160 and 170 are made by ink-jet printing multiple drops of liquid onto the substrate. One deposit acts as a target deposit, the other as a confining deposit. Deposit 160 is produced first. Deposit 170 is then applied to the substrate in partially overlapping relationship with deposit 160. After stabilisation of the deposited layers, the cross-sectional configuration shown in FIG. 11 is obtained. The interfacial plane 180 is accurately and uniquely defined by the surface tension forces acting between the two immiscible liquids. As a consequence, a solid target deposit may be produced with an edge precisely defined by the confining liquid. As before, the target deposit may contain a suspension or solute of material to be deposited following evaporation, or will itself solidify to form the target layer.

The resulting target layer may be electrically conductive or insulative depending on the constitution of the target deposit.

Figure 12A:
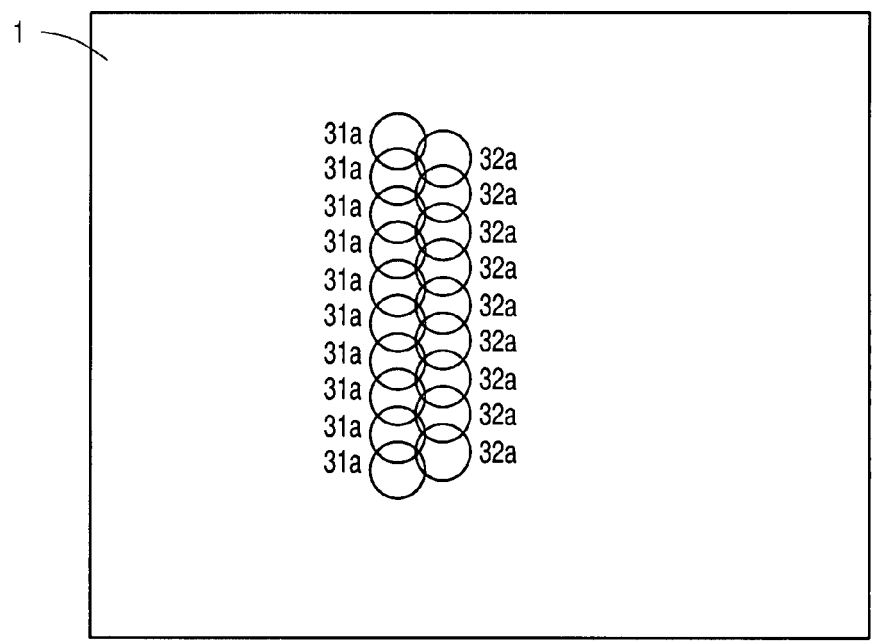
FIG. 12a is a plan view of a sequence of multiple drops deposited as a linear deposit on a substrate.
Figure 12B:
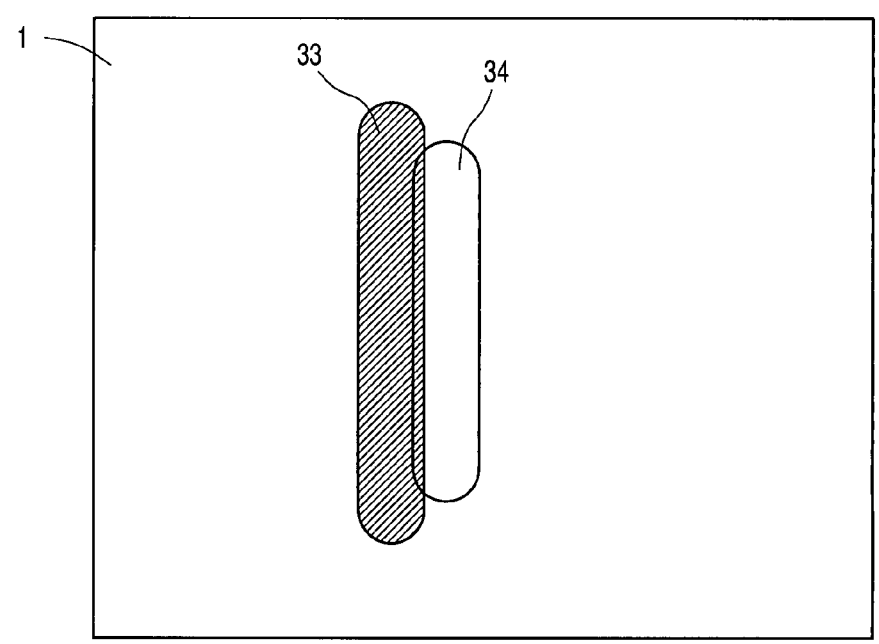
FIG. 12b is a plan view of the equilibrium state of the sequence of multiple drops deposited as a linear deposit on a substrate.

FIGS. 12a and 12b illustrate a method where a sequence of multiple drops are printed on a substrate 1. Specifically, FIG. 12a illustrates a sequence of multiple drops 31a being printed on the substrate 1 to form a first linear deposit upon the sequence of multiple drops 31a reaching an equilibrium state. FIG. 12a also shows a sequence of multiple drops 32a being printed on the substrate 1 to form a second linear deposit upon the sequence of multiple drops 32a reaching an equilibrium state. FIG. 12b illustrates the sequences of multiple drops 31a and 32a of FIG. 12a after they have reached an equilibrium state. Specifically, the sequence of multiple drops 31a being printed on the substrate 1 shown in FIG. 12a forms a first linear deposit 33 shown in FIG. 12b. Similarly, the sequence of multiple drops 32a being printed on the substrate 1 shown in FIG. 12a forms a second linear deposit 34 shown in FIG. 12b. As discussed with respect to FIGS. 10 and 11, after stabilisation of the deposited layers, the cross-sectional configuration shown in FIG. 11 is obtained.

Although the illustrated embodiments show the various deposited linear regions, such as 15 to 20, as straight, it will be appreciated that the techniques disclosed are in principle applicable to the most varied geometrical shapes including arcuate regions, enclosed polygons etc. subject only to the practical constraints imposed by the ink-jet printing techniques.

As described, it is preferred that the source, drain and gate electrodes are deposited by ink-jet printing using PEDOT, but other materials may be used. Examples of alternative materials for the source, drain and gate electrodes are conjugated polymer such as polypyrole, polythiophene, polyaniline and their derivatives. They become conductive when doped with inorganic, organic, or polymeric dopant. Colloids of metals can also be used for the electrodes. Organic-metal complex compounds which enable deposition of metal are useful materials for electrodes.

For the semiconductor layer, the following are suitable: conjugated polymer such as poly(3-alkylthiophene)(poly(3-hexylthiophene) (P3HT), poly(3-octylthiophene)), poly(2,5-thienylenevinylene)(PTV), poly(para-phenylenevinylene) (PPV), poly(9,9-dioctylfluorene)(PFO), poly(9,9-diocytifluorene-co-bis-N, N'-(4-methoxyphenyl)-bis-N, N-'-phenyl-1,4-phenylenediamine) (PFMO) and poly(9,9-dioctylfluorene-co-benzothiadiazole) (BT), fluorene-triarylamine copolymer, triarylamine-based polymers.

Semiconductors having small molecules such as alpha-oligothiophene (quaterthiophene(4T), sexithiophene(6T), octithiophene(8T), dihexylquaterthiophene(DH4T), dihexyl-sexithiophene(DH6T)), C-60, phthalocyanine(copper phthalocyanine(Cu-Pc)), pentacene are also suitable.

For the insulator layer, polystyrene(PS), polyimide(PI), polymethylmethacrylate(PMMA), polycarbonate(PC), polyvinylalcohol(PVA) and polyvinylacetate(PVAc) are suitable.

It will be appreciated that the methods described solve two fundamental problems in the prior art as disclosed in the Kawase paper. Firstly, the previous art needs photolithography and a dry etching process in order to make the polyimide strip which defines the short channel. The disclosed methods according to the invention enable such short channel to be printed without any pre-patterning. Secondly, the previous art according to the Kawase paper does not provide any measures to narrow a gate line and interconnection. The gate has a width of 40-80 microns, even though the channel length is 5 microns. This means the gate has a large amount of overlap with the source and drain electrodes, which results in a large parasitic capacitance in the thin film transistor. Such a large parasitic capacitance lowers the operational speed in a circuit, and induces a feed-through effect in an active matrix display. It is difficult to make pre-patterns on the insulator with good alignment with the channel. The use of direct ink-jet printing as in the present methods enables the narrow gate electrode to be formed with high resolution without the need for pre-patterning and the associated cost.

Of course, making interconnections narrower is also important in practice. Narrow interconnections provide a high density in an integrated circuit and a large aperture ratio in an active matrix display.

The advantages of the manufacturing methods disclosed hereinabove with reference to the drawings can be achieved not only when using ink jet printing for forming the various liquid deposits, but also when using other techniques for depositing the liquid deposits, such as by bubble jet printing.

The invention claimed is:

1. A method of fabricating a high-resolution pattern on a substrate, comprising the steps of:
   depositing a sequence of multiple drops of a first liquid material as a first linear deposit on the substrate;
   depositing a sequence of multiple drops of a second liquid material as a second linear deposit on the substrate, and in contact with the first material while the first material is liquid, the first and second liquid materials being mutually immiscible and having an elongate planar common interface; and
   producing on the substrate a solid deposit from at least one of the deposited liquid materials, the solid linear deposit having an edge defined by said elongate planar common interface.

2. A method according to claim 1, further comprising depositing a sequence of multiple drops of liquid material immiscible with said second liquid material as a third linear deposit on the substrate, the third linear deposit being spaced from the first by a predetermined gap and the second linear deposit being applied in said gap overlapping the first and third linear deposits, and having a first elongate planar common interface with the first linear deposit and a second elongate planar common interface with the third deposit.

3. A method according to claim 2, in which a solid deposit is produced from the second liquid material, and has first and second edges defined by the first and second elongate planar common interfaces.

4. A method according to claim 1, further comprising depositing a sequence of multiple drops of liquid material immiscible with said first liquid material as a third linear deposit on the substrate, the third linear deposit being applied in contact with the first material while the first material is liquid and being spaced from the second material by a predetermined gap containing the first linear deposit, the second linear deposit having first and second elongate planar common interfaces with the first and third deposits respectively.

5. A method according to claim 4, in which solid deposits are produced from the second and third liquid materials.

6. A method according to claim 1, wherein the sequence of multiple drops of at least one of the first, second and third liquid materials are linearly deposited by ink jet printing.

7. A method according to claim 1, wherein at least one of the first linear deposit, the second linear deposit and the third linear deposit contains a suspension or solute, and a solid deposit is formed by the material of the suspension or solute.

8. A method according to claim 7, in which said solid deposit is electrically conductive.

9. A method according to claim 8, in which a solid deposit is produced from the second liquid material, wherein the first and third linear deposits are confining deposits and the second linear deposit is a target deposit comprising electrically conductive material.

10. A method according to claim 9, in which the electrically conductive material is a suspension of metal particles, e.g. Au, Ag, Cu, Pt, Pd or Al particles.

11. A method according to claim 10, in which the suspension is in non-polar organic solvent.

12. A method according to claim 11, in which the first and third deposits comprise water or a polar organic solvent.

13. A method according to claim 9, in which the electrically conductive material contains a conductive polymer.

14. A method according to claim 13, in which the polymer is poly(3,4-ethylenedioxythiophene), a derivative thereof, polyanilin or a derivative thereof.

15. A method according to claim 13, in which the second linear deposit comprises a non-polar organic solvent.

16. A method according to claim 15, in which the solvent of the second linear deposit comprises a polymeric solute.

17. A method according to claim 8, in which solid deposits are produced from the second and third liquid materials and in which the first and third linear deposits are target deposits containing electrically conductive material and the second deposit is a spacing deposit.

18. A method of manufacturing a thin film transistor in which the source and drain electrodes are fabricated from the first and third linear deposits according to the method of claim 17.

19. A method according to claim 18, in which the channel length is less than 50 µm.

20. A method according to claim 19, in which the channel length is substantially 10 µm.

21. A method of manufacturing an active matrix TFT array in which the thin film transistors are fabricated according to claim 18.

22. A method according to claim 21, in which the pixel electrodes are fabricated by ink-jet printing.

23. A method of manufacturing an integrated circuit in which data or signal lines are fabricated as the second linear deposit according to the method of claim 9.

24. A method according to claim 23, in which the data or signal lines have a width less than 50 µm.

25. A method according to claim 24, in which said width is substantially 10 µm.

26. A method of manufacturing an active matrix TFT array, comprising fabricating thin film transistors in which at least one source electrode and at least on drain electrode are fabricated from the first and third linear deposits and the signal or data lines are fabricated as the second linear deposit, according to the method of claim 8,
   wherein solid deposits are produced from the second and third liquid materials, wherein the first and third linear deposits are confining deposits and the second linear deposit is a target deposit comprising electrically conductive material, and
   wherein the first and third linear deposits are target deposits containing electrically conductive material.

27. A method according to claim 1, in which a solid deposit is formed by solidification of at least one of said liquid materials.

28. A method according to claim 1, wherein none of the deposits is electrically conductive.

29. A method of manufacturing an optical waveguide in which the waveguide is fabricated as the second linear deposit according to the method of claim 28, further comprising depositing a sequence of multiple drops of liquid material immiscible with said second liquid material as a third linear deposit on the substrate, the third linear deposit being spaced from the first by a predetermined gap and the second linear deposit being applied in said gap overlapping the first linear deposit and the third linear deposit.

30. A method according to claim 29, wherein the second deposit comprises polymer.

31. A method of manufacturing a separator of a plasma display panel in which a wall structure is fabricated as the second linear deposit according to the method of claim 28, further comprising depositing a sequence of multiple drops of liquid material immiscible with said second liquid material as a third linear deposit on the substrate, the third linear deposit being spaced from the first linear deposit by a predetermined gap and the second linear deposit being applied in said gap overlapping the first and third deposits.

32. A method according to claim 31, wherein the second linear deposit comprises inorganic colloid.

33. A method according to claim 31, wherein the third region comprises polymer.

* * * * *